(12) United States Patent
Nakajima

(10) Patent No.: US 8,049,653 B2
(45) Date of Patent: Nov. 1, 2011

(54) AMPLIFIER AND ANALOG/DIGITAL CONVERTER

(75) Inventor: Yuji Nakajima, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/717,237

(22) Filed: Mar. 4, 2010

(65) Prior Publication Data

US 2010/0231430 A1  Sep. 16, 2010

(30) Foreign Application Priority Data

Mar. 11, 2009 (JP) ................................. 2009-057599

(51) Int. Cl.
*H03M 1/34* (2006.01)
(52) U.S. Cl. ........................................ 341/158; 330/256
(58) Field of Classification Search .......... 341/130–155; 330/252, 296, 254, 300, 69, 51
See application file for complete search history.

(56) References Cited

U.S. PATENT DOCUMENTS

| 4,602,167 | A |   | 7/1986 | Yukawa |   |
|---|---|---|---|---|---|
| 4,926,271 | A | * | 5/1990 | Aoki et al. ...................... | 360/62 |
| 6,147,514 | A |   | 11/2000 | Shiratake |   |
| 6,728,240 | B1 |   | 4/2004 | Dally et al. |   |
| 7,026,874 | B2 | * | 4/2006 | Vaara et al. ..................... | 330/256 |
| 7,078,968 | B2 | * | 7/2006 | Gaeta et al. ..................... | 330/254 |
| 2004/0090254 | A1 | * | 5/2004 | Owens et al. .................. | 327/170 |
| 2004/0166821 | A1 | * | 8/2004 | Varra et al. .................. | 455/240.1 |
| 2005/0057306 | A1 | * | 3/2005 | Gaeta et al. ..................... | 330/254 |

FOREIGN PATENT DOCUMENTS

| JP | 09043019 | * | 7/1995 |
| JP | 11-176163 | A | 7/1999 |

OTHER PUBLICATIONS

D. Schinkel et al., "A Double-Tail Latch-Type Voltage Sense Amplifier With 18 ps Setup+Hold Time", Solid-State Circuits Conference 2007. ISSCC 2007. Digest of Technical Papers IEEE International, Feb. 2007, pp. 314-315, 605.

* cited by examiner

*Primary Examiner* — Lam T Mai
(74) *Attorney, Agent, or Firm* — Foley & Lardner LLP

(57) ABSTRACT

An amplifier that is operated between first and second power supplies includes a transistor pair having control terminals to which input signals are input, a load resistor pair that is provided between each transistor of the transistor pair and the first power supply, a constant current source that is provided between the second power supply and the transistor pair, and a first switch that is connected with the constant current source in series between the second power supply and the transistor pair, the first switch being turned on or off in accordance with a clock signal.

10 Claims, 15 Drawing Sheets

Fig. 8A  $I_{BIAS}$=50μA
VoutN  VoutP
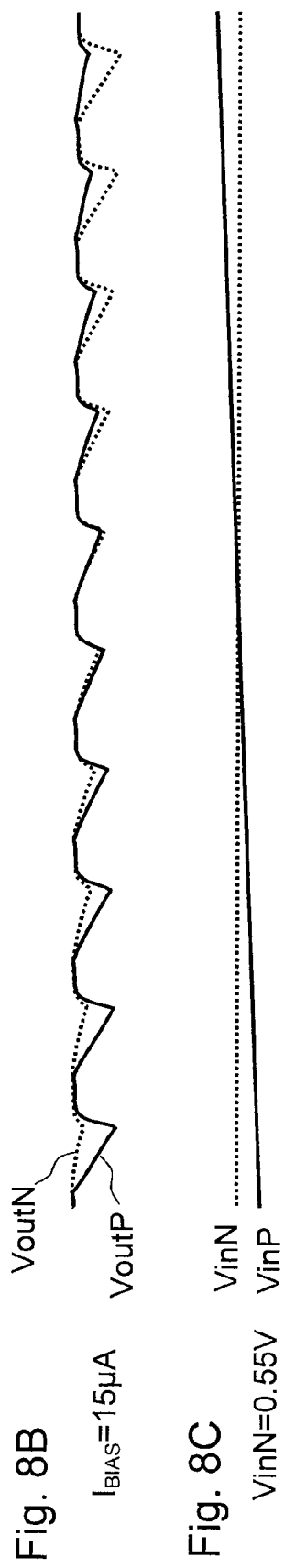
Fig. 8B  $I_{BIAS}$=15μA
VoutN  VoutP
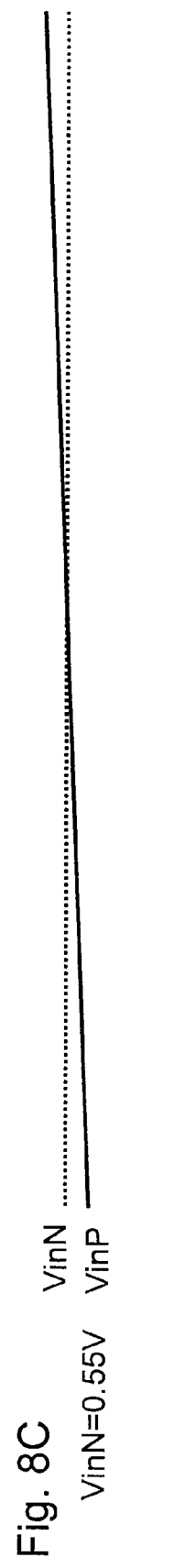
Fig. 8C  VinN=0.55V
VinN  VinP
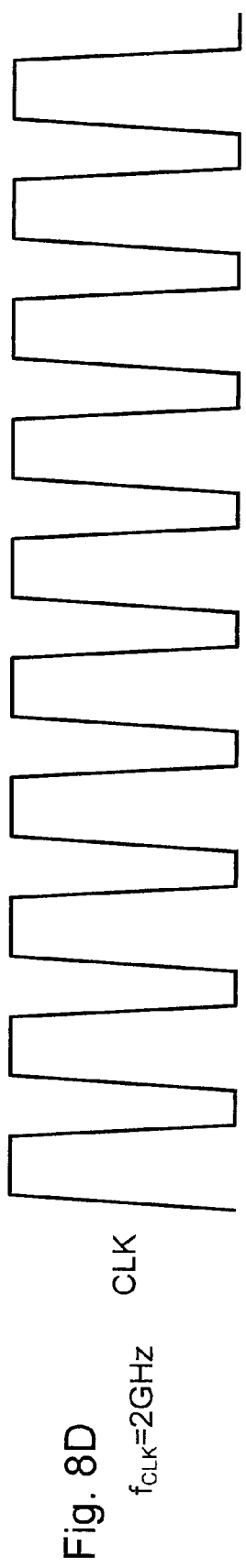
Fig. 8D  $f_{CLK}$=2GHz
CLK

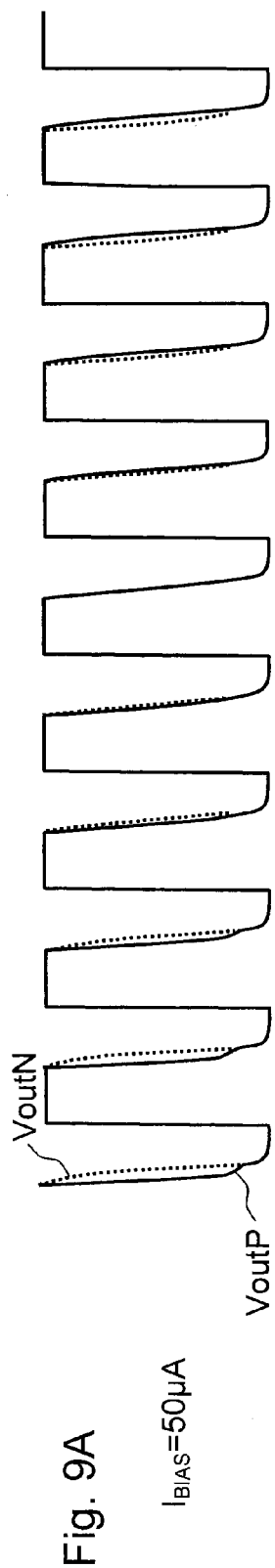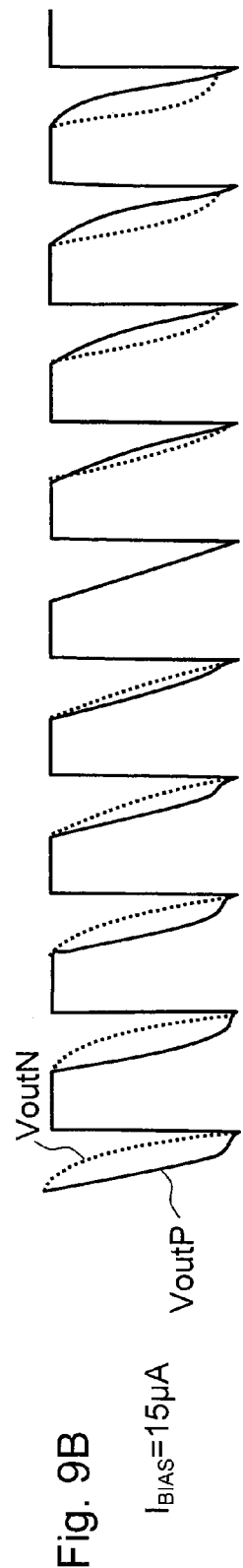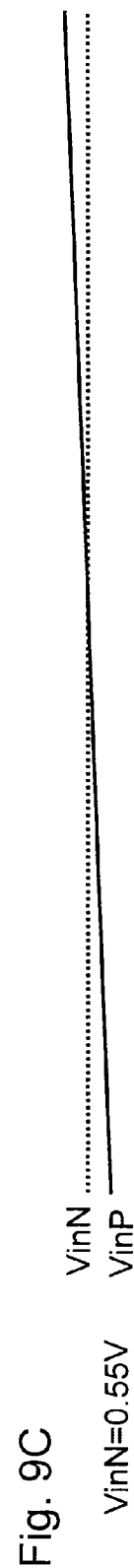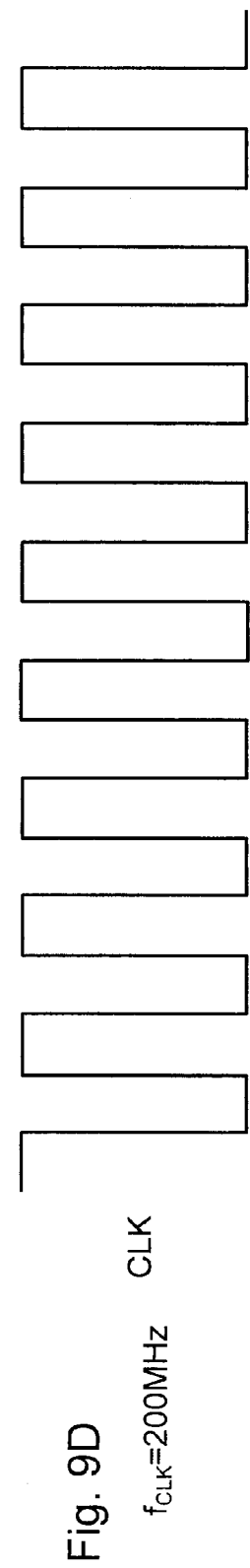
Fig. 9A  $I_{BIAS}=50\mu A$
Fig. 9B  $I_{BIAS}=15\mu A$
Fig. 9C  VinN=0.55V
Fig. 9D  $f_{CLK}=200MHz$

AMPLIFIER AND ANALOG/DIGITAL CONVERTER

INCORPORATION BY REFERENCE

This application is based upon and claims the benefit of priority from Japanese patent application No. 2009-057599, filed on Mar. 11, 2009, the disclosure of which is incorporated herein in its entirety by reference.

BACKGROUND

1. Field of the Invention

The present invention relates to an amplifier and an analog/digital converter using the amplifier.

2. Description of Related Art

An analog/digital converter (A/D converter) includes a comparator that compares an analog voltage signal with reference voltage. This comparator has an input-referred offset, and this offset varies depending on the manufacturing process. Thus, as shown in FIG. 5 in the specification of U.S. Pat. No. 4,602,167, for example, the signal input to the comparator is amplified by a preamp to the signal level that is sufficiently larger than the input-referred offset. A preamp that is disclosed in the specification of U.S. Pat. No. 4,602,167 is a typical differential amplifier that includes a constant current source between an input transistor pair and a power supply. As such a preamp is included, signal comparison can be performed with high accuracy. However, the current needs to be constantly flowed, which increases power consumption.

Meanwhile, FIG. 17 shows a circuit diagram of a sense amplifier shown in FIG. 2 of an article by Schinkel et al., titled "A Double-Tail Latch-Type Voltage Sense Amplifier with 18 ps Setup+Hold Time" (Solid-State Circuits Conference, 2007. ISSCC 2007. Digest of Technical Papers. IEEE International, February 2007, pp. 314-315, 605). This sense amplifier includes input transistors N1, N2 that are NMOS transistors, load transistors P1, P2 that are PMOS transistors, and a switch transistor N3 that is an NMOS transistor. Here, input signals VinP and VinN are input to gates of the input transistors N1, N2, respectively. Further, a clock signal CLK is input to gates of the load transistors P1, P2 and a gate of the switch transistor N3. Thus, the load transistors P1, P2 and the switch transistor N3 are turned on or off in a complementary manner.

More specifically, when the clock signal CLK is H (High), the load transistors P1, P2 are OFF, and the switch transistor N3 is ON, which means an amplification period. On the other hand, when the clock signal CLK is L (Low), the load transistors P1, P2 are ON, the switch transistor N3 is OFF, which means a reset period. In the reset period, both of output signals VoutP, VoutN are reset to a power supply voltage VDD. In the reset period, the switch transistor N3 is OFF, and the current is interrupted. Thus, the power consumption is decreased than in the preamp in the specification of U.S. Pat. No. 4,602,167. The similar sense amplifier is disclosed also in FIG. 1 of Japanese Unexamined Patent Application Publication No. 11-176163. Further, a technique of adjusting an offset amount using a variable capacitor is disclosed in the specification of U.S. Pat. No. 6,728,240.

SUMMARY

However, according to the sense amplifier disclosed by Schinkel et al., the source potentials of the input transistors N1, N2 abruptly decrease to the ground voltage GND as soon as the amplification period is started, and are fixed to the ground voltage GND during the amplification period. As the input transistors N1, N2 do not function as the differential pair but as the source ground, the speed of decrease of the output signals VoutP, VoutN strongly depends on the input common voltage. Accordingly, in order to stabilize the circuit operation, the range of the input common voltage needs to be narrowed. On the other hand, in the above-mentioned preamp for A/D converter, the range of the input common voltage needs to be widened. Thus, it is difficult to apply the circuit configuration disclosed by Schinkel et al. to the above-mentioned preamp for A/D converter.

A exemplary aspect of the present invention is an amplifier that is operated between first and second power supplies including: a transistor pair having control terminals to which input signals are input; a load resistor pair that is provided between each transistor of the transistor pair and the first power supply; a constant current source that is provided between the second power supply and the transistor pair; and a first switch that is connected with the constant current source in series between the second power supply and the transistor pair, the first switch being turned on or off in accordance with a clock signal.

The amplifier according to the present invention includes the constant current source that is provided between the second power supply and the transistor pair, and the first switch that is connected to the constant current source in series and is turned on or off in accordance with the clock signal. Hence, it is possible to provide an amplifier and an analog/digital converter that are stably operated for wide range of input common voltage with low power consumption.

According to the present invention, it is possible to provide an amplifier and an analog/digital converter that are stably operated for wide range of input common voltage with low power consumption.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 8A to 8D are simulation waveform diagrams of output signals from a preamp PA100 according to the first exemplary embodiment when a clock frequency $f_{CLK}$ is 2 GHz;

FIGS. 9A to 9D are simulation waveform diagrams of output signals from the preamp PA100 according to the first exemplary embodiment when a clock frequency $f_{CLK}$ is 200 MHz;

DETAILED DESCRIPTION OF THE EXEMPLARY EMBODIMENTS

The specific exemplary embodiments to which the present invention is applied will be described in detail with reference to the drawings. However, the present invention is not limited to the exemplary embodiments that will be described below. In particular, it does not need to say that the structure obtained by inverting polarities of PMOS transistors and NMOS transistors is possible. Further, some of the description and the drawings are simplified as appropriate for the sake of clarity.

First Exemplary Embodiment

Figure 1:
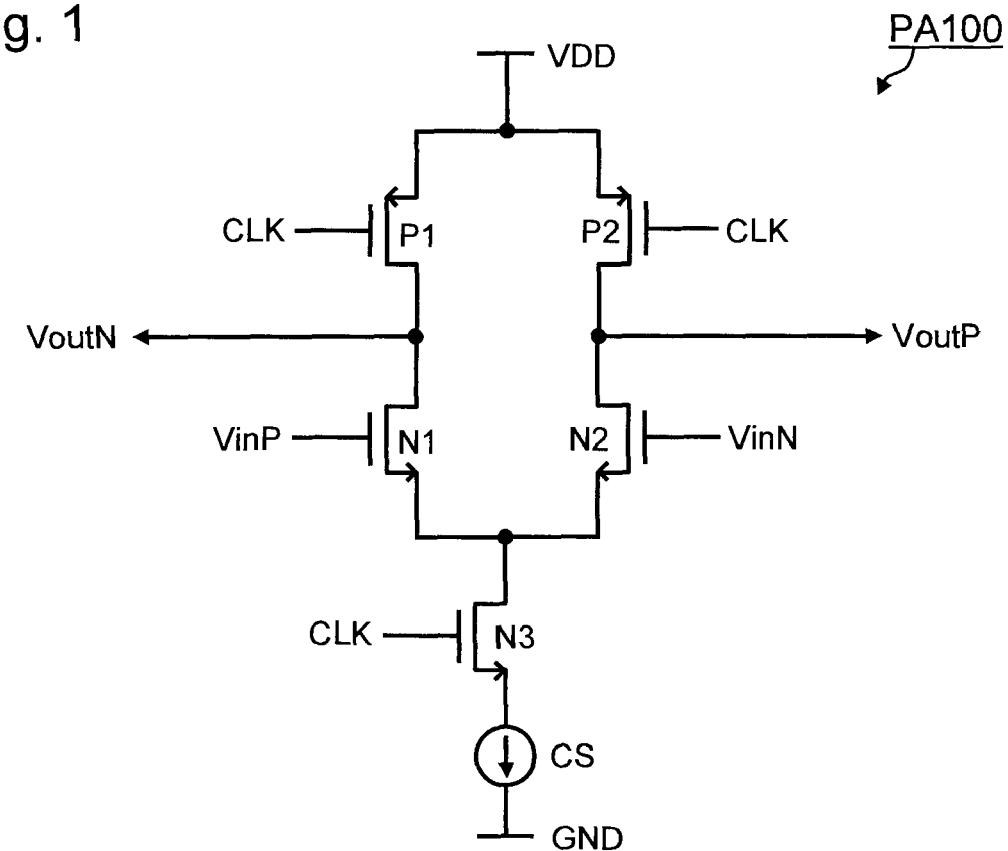
FIG. 1 is a circuit diagram of an amplifier according to a first exemplary embodiment.
Figure 2:
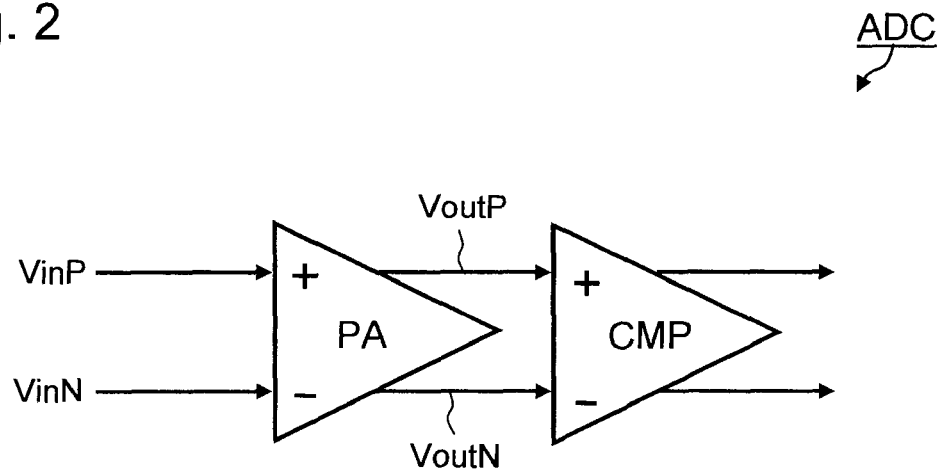
FIG. 2 is a diagram showing an example in which the amplifier according to the first exemplary embodiment is applied to an A/D converter.

FIG. 1 is a circuit diagram of an amplifier according to the first exemplary embodiment of the present invention. FIG. 2 is a diagram showing an example in which the amplifier according to the first exemplary embodiment is applied to an analog/digital converter (A/D converter) ADC. As shown in FIG. 2, a preamp PA amplifies an input signal VinP input to a non-inverting input terminal and an input signal VinN input to an inverting input terminal, and outputs output signals VoutP and VoutN to each of a non-inverting input terminal and an inverting input terminal of a comparator CMP. A preamp PA100 shown in FIG. 1 is suitable as the preamp PA shown in FIG. 2.

As shown in FIG. 1, the preamp PA100 includes input transistors N1 and N2 that are NMOS transistors, load transistors P1 and P2 that are PMOS transistors, a switch transistor N3 that is an NMOS transistor, and a constant current source CS.

Now, sources of the load transistors P1 and P2 are both connected to a power supply (for example, first power supply, power supply voltage VDD). Each of drains of the load transistors P1, P2 is connected to drains of the input transistors N1 and N2, respectively. The output signal VoutN is output from a node (output node) between the drain of the load transistor P1 and the drain of the input transistor N1, and the output signal VoutP is output from a node (output node) between the drain of the load transistor P2 and the drain of the input transistor N2.

Sources of the input transistors N1, N2 are both connected to a drain of the switch transistor N3. The input signal VinP is input to a gate of the input transistor N1. The input signal VinN is input to a gate of the input transistor N2. A source of the switch transistor N3 is connected to a terminal of the constant current source CS. The other terminal of the constant current source CS is connected to a ground (for example, second power supply, ground voltage GND). Note that the positional relation of the switch transistor N3 and the constant current source CS may be inverted.

Further, a clock signal CLK is input to gates of the load transistors P1 and P2, and a gate of the switch transistor N3. Thus, the load transistors P1, P2 and the switch transistor N3 are turned on or off in a complementary manner.

Specifically, when the clock signal CLK is H (High), the load transistors P1, P2 are OFF and the switch transistor N3 is ON, which means an amplification period. The preamp PA100 according to the first exemplary embodiment includes the constant current source CS between the input transistors N1 and N2 and the ground. Thus, the source potentials of the input transistors N1, N2 are not abruptly decreased to the ground potential as soon as the amplification period is started, and are not fixed to the ground potential in the amplification period. In short, the input transistors N1, N2 function as a differential pair, and the dependency of the speed of decrease of the output signals VoutP and VoutN with respect to the input common voltage is small. Hence, the range of the input common voltage can be widened.

On the other hand, when the clock signal CLK is L (Low), the load transistors P1, P2 are ON and the switch transistor N3 is OFF, which means a reset period. In the reset period, the output signals VoutP, VoutN are both reset to the power supply voltage VDD. Further, in the reset period, the switch transistor N3 is OFF, and the current is interrupted. Thus, low power consumption is realized. The preamp PA100 according to the first exemplary embodiment is stably operated for wide range of input common voltage with low power consumption. The dependency of the input common voltage will be described hereinafter in detail.

Figure 3:
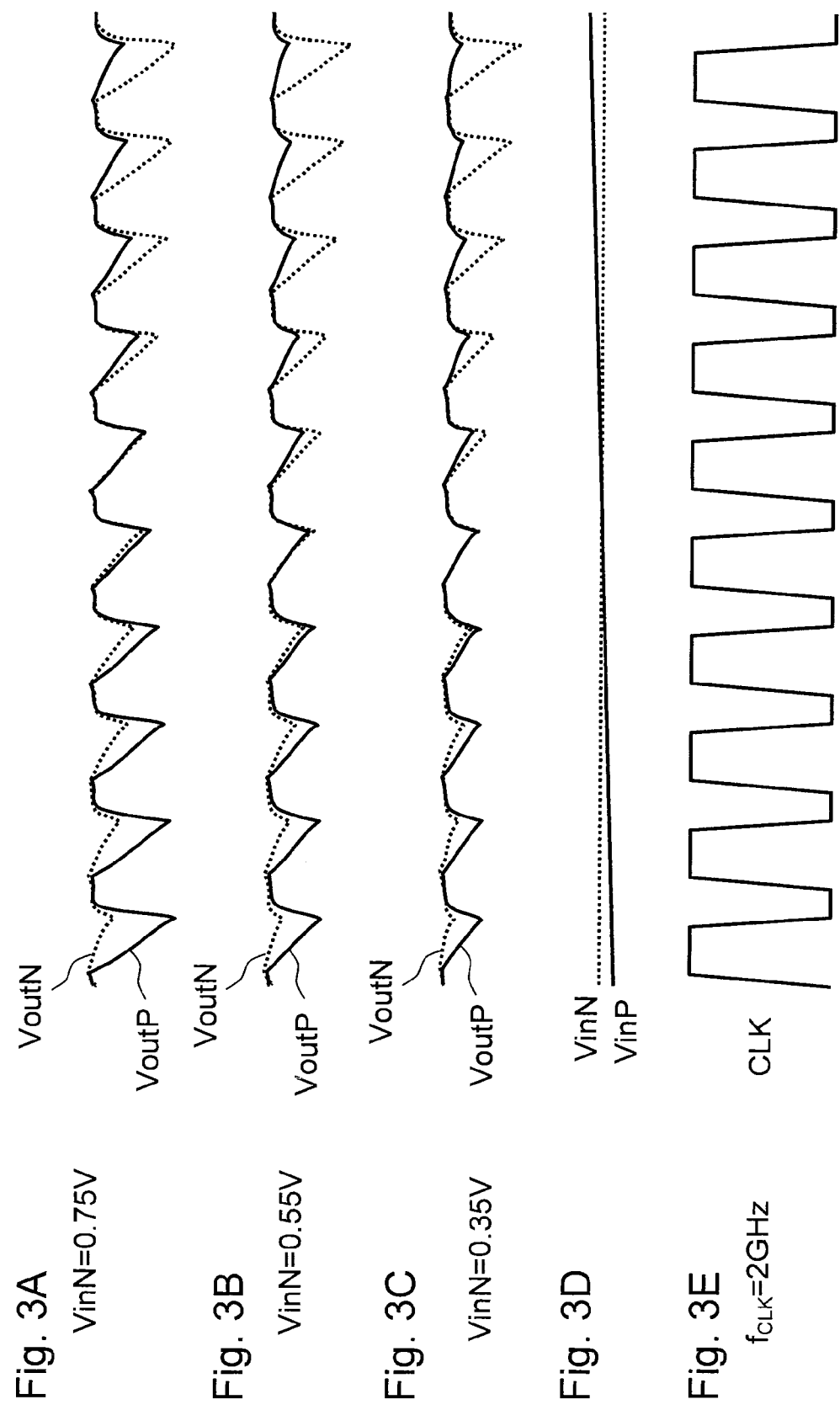
FIGS. 3A to 3E are simulation waveform diagrams of output signals from the amplifier according to the first exemplary embodiment.

Next, the dependency of the input common voltage of the output signals VoutP and VoutN will be described with reference to FIG. 3. FIGS. 3A to 3E are simulation waveform diagrams of output signals from the amplifier according to the first exemplary embodiment. FIG. 3A shows simulation waveforms when the input signal VinN is 0.75 V, FIG. 3B shows simulation waveforms when the input signal VinN is 0.55 V, FIG. 3C shows simulation waveforms when the input signal VinN is 0.35 V, FIG. 3D shows waveforms of the input signals VinP, VinN, and FIG. 3E shows a waveform of the clock signal CLK.

In FIGS. 3A, 3B, 3C, the output signals VoutP are shown by solid lines, and the output signals VoutN are shown by dotted lines. Further, in FIG. 3D, the input signal VinP is shown by a solid line, and the input signal VinN is shown by a dotted line. As shown in FIG. 3D, in this simulation, the input signal VinN is set to a certain fixed value, and the input signal VinP is swept with respect to this input signal VinN. Specifically, as shown in FIG. 3D, the input signal VinP is gradually and linearly changed to transit from VinN>VinP, through VinN=VinP, to VinN<VinP. Thus, the input common voltage satisfies Vc=VinN. Further, as shown in FIG. 3E, the frequency $f_{CLK}$ of the clock signal CLK is 2 GHz.

When the clock signal CLK is L in FIG. 3E, the preamp PA100 is in the reset period. Both of the output signals VoutP and VoutN shown in FIGS. 3A, 3B, 3C are reset to the power supply voltage VDD. On the other hand, when the clock signal CLK is H in FIG. 3E, the preamp PA100 is in the amplification period. Each of the output signals VoutP and VoutN shown in FIGS. 3A, 3B, 3C is decreased from VDD in accordance with the input signals VinN, VinP, and thus the difference of the output signals VoutP, VoutN is amplified. As shown in FIGS. 3A, 3B, 3C, in the amplifier according to the first exemplary embodiment, the adequate differential gain is obtained in any condition of the input signal VinN=0.75 V, VinN=0.55 V, VinN=0.35 V.

Figure 4:
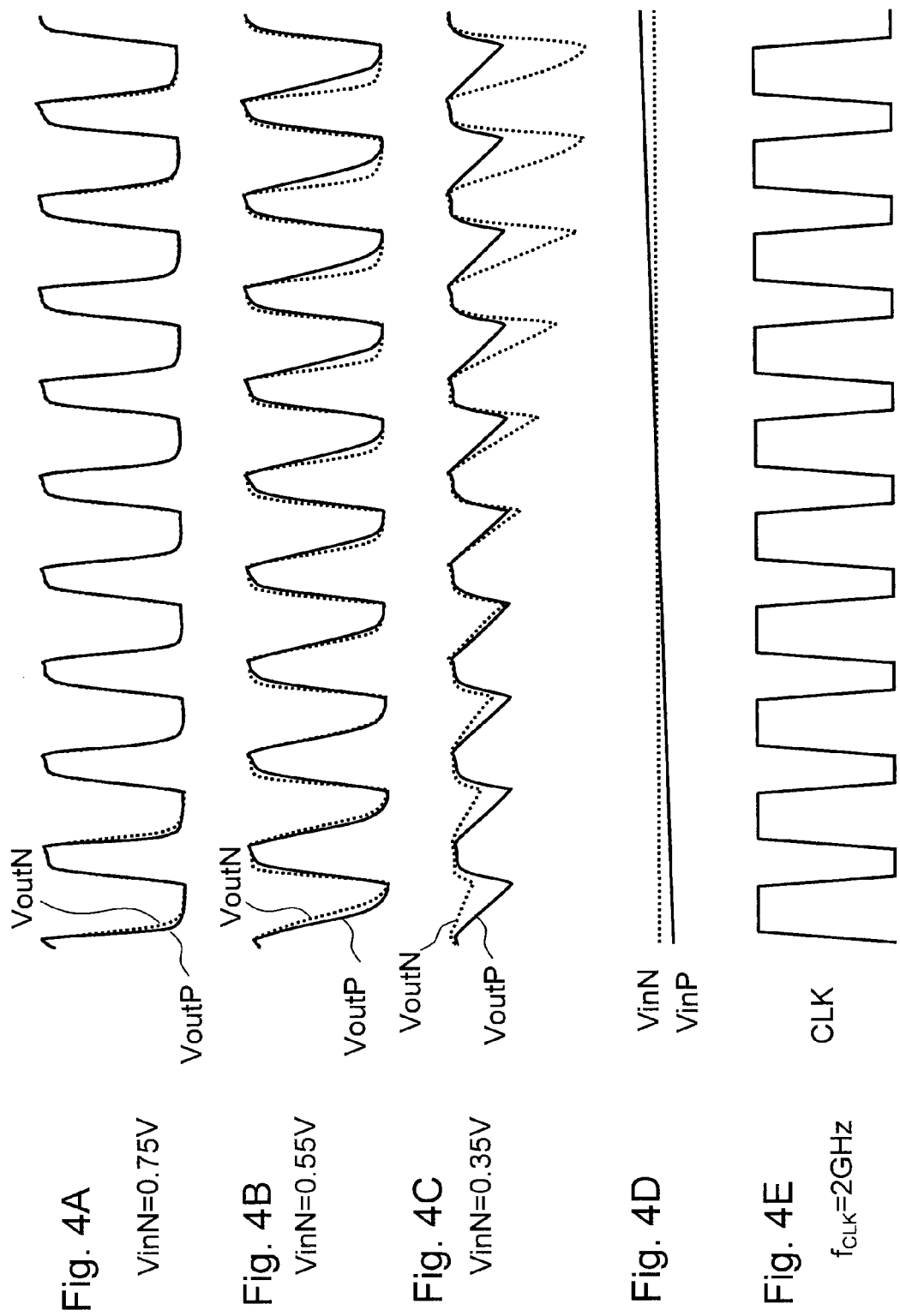
FIGS. 4A to 4E are simulation waveform diagrams of output signals from an amplifier shown in FIG. 17.
Figure 17:
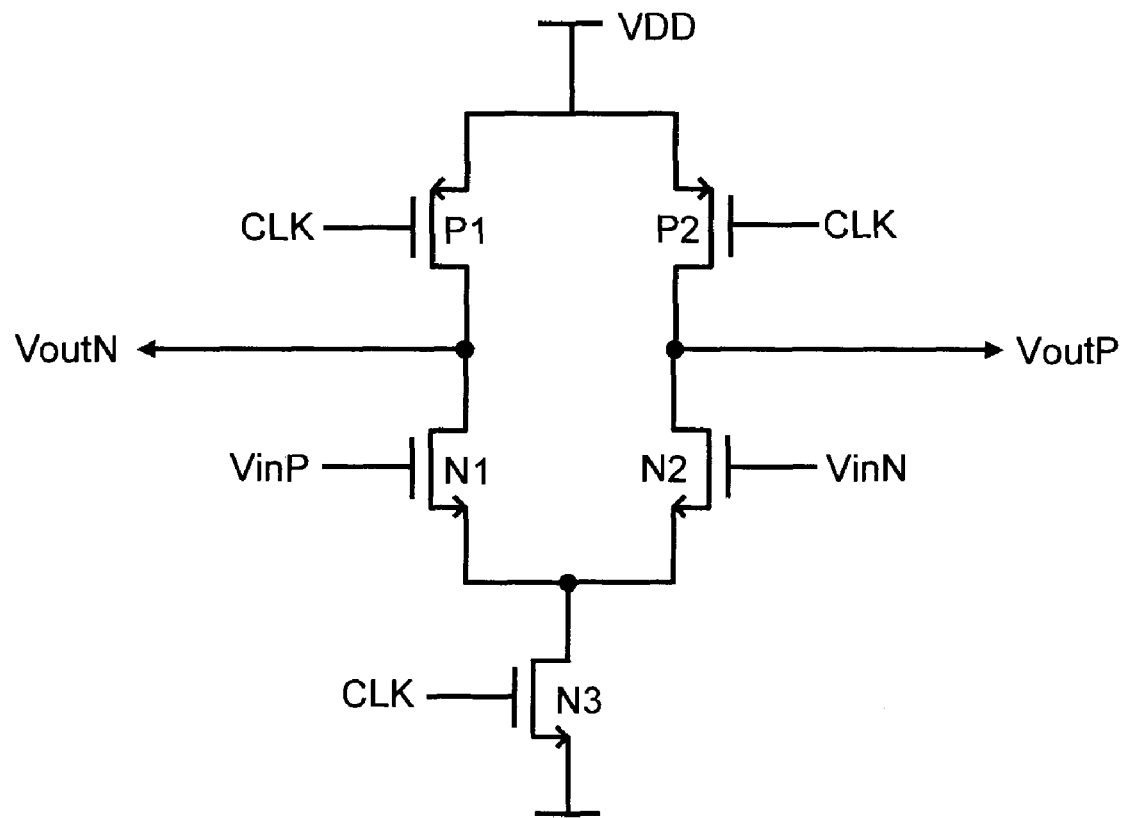
FIG. 17 is a circuit diagram of a sense amplifier shown in FIG. 2 of Schinkel et al.

Next, FIGS. 4A to 4E are simulation waveform diagrams of output signals from the amplifier shown in FIG. 17. As is similar to FIGS. 3A to 3E, FIG. 4A shows simulation waveform diagrams when the input signal VinN is 0.75 V, FIG. 4B shows simulation waveform diagrams when the input signal VinN is 0.55 V, FIG. 4C shows simulation waveform diagrams when the input signal VinN is 0.35 V, FIG. 4D shows waveforms of the input signals VinP, VinN, and FIG. 4E shows a waveform of the clock signal CLK. The simulation condition is similar to that shown in FIG. 3. In the amplifier shown in FIG. 17, although the adequate differential gain is obtained with the input signal VinN=0.35 V shown in FIG. 4C, the adequate differential gain is not obtained with the input signal VinN=0.75 V and VinN=0.55 V shown in FIGS. 4A and 4B.

As stated above, in the preamp PA100 according to the first exemplary embodiment, the dependency of the speed of decrease of the output signals VoutP and VoutN with respect to the input common voltage is small, and thus it is possible to widen the range of the input common voltage.

Second Exemplary Embodiment

Figure 5:
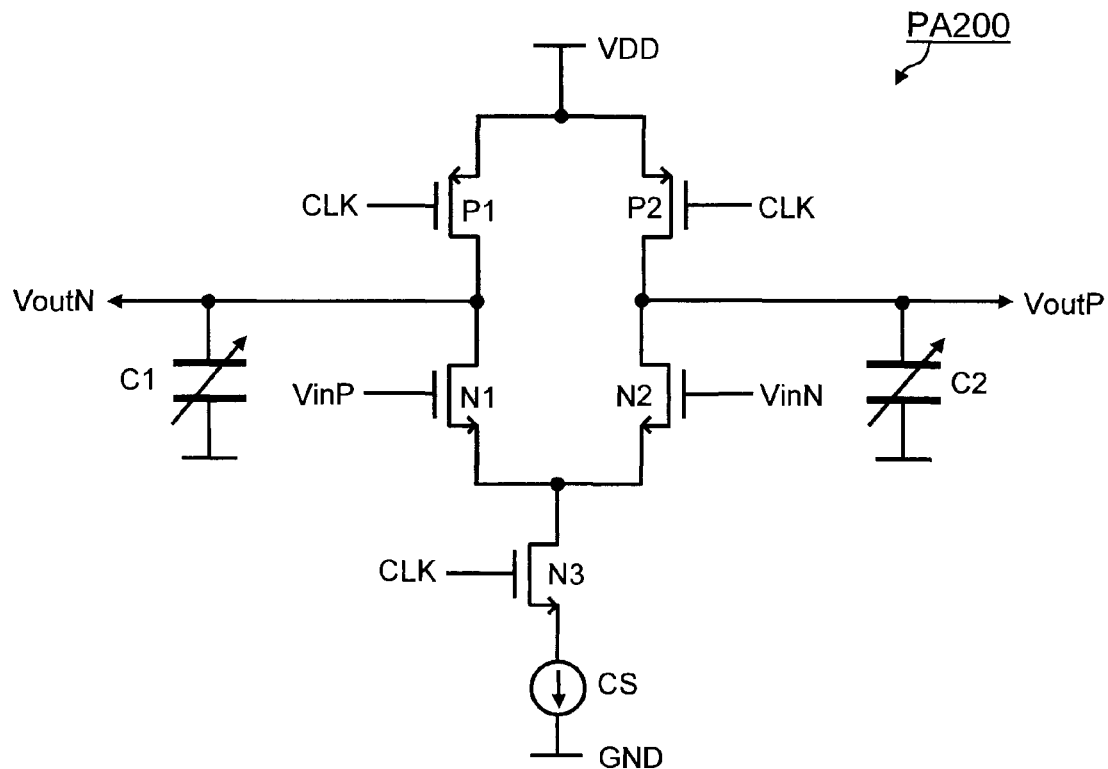
FIG. 5 is a circuit diagram of an amplifier according to a second exemplary embodiment.

Referring next to FIG. 5, the second exemplary embodiment of the present invention will be described. FIG. 5 is a circuit diagram of an amplifier according to the second exemplary embodiment. A preamp PA200 shown in FIG. 5 is different from the preamp PA100 shown in FIG. 1 in that variable capacitors C2 and C1 are connected to the output nodes of the output signals VoutP, VoutN, respectively. Other structures are similar to those shown in FIG. 1, and thus description will be omitted here.

With the miniaturization of the transistors for realizing high-speed operation and low power consumption, the input-referred offset voltage due to the manufacturing variations between the transistor elements is increased. This input-referred offset voltage leads to the characteristics degradation of the A/D converter. Hence, in the preamp PA200 according to the second exemplary embodiment, the variable capacitors C2 and C1 are connected to the output nodes of the output signals VoutP, VoutN, respectively. By adjusting the capacitances of the variable capacitors C1, C2, the input-referred offset voltage can be controlled.

Figure 6:
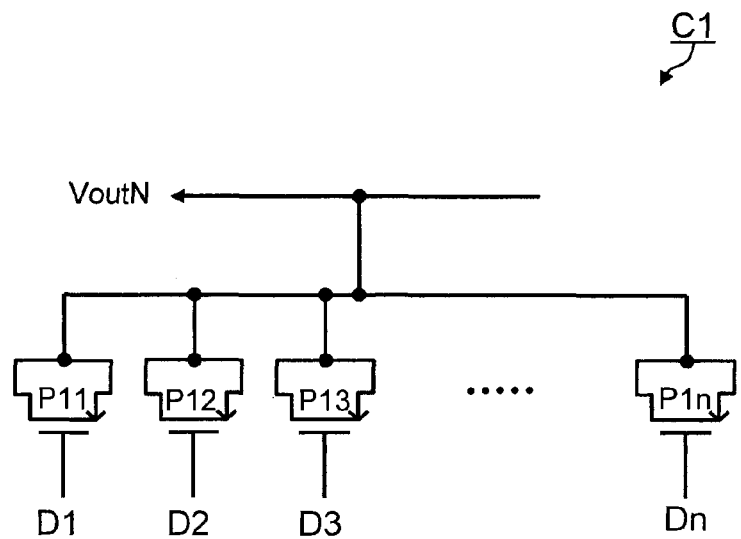
FIG. 6 is a specific example of a variable capacitor C1.

FIG. 6 is a specific example of the variable capacitor C1. As shown in FIG. 6, the variable capacitor C1 includes PMOS transistors P11, P12, P13, ..., P1$n$ (n is a natural number). Digital control signals D1, D2, D3, ..., Dn are input to gates of the PMOS transistors P11, P12, P13, ..., P1$n$. A source and a drain of each of the PMOS transistors P11, P12, P13, ..., P1$n$ are connected together, and are connected to the output node of the output signal VoutN in common.

In summary, the variable capacitor C1 includes the PMOS transistors P11, P12, P13, ..., P1$n$ connected in parallel with each other. For example, when the digital control signal D1 that is input to the gate of the PMOS transistor P11 is L, a channel is formed and the capacitance becomes larger. On the other hand, when the digital control signal D1 that is input to the gate of the PMOS transistor P11 is H, the channel is not formed and the capacitance becomes smaller. By separately controlling the digital control signals D1, D2, D3, ... Dn input to each gate of each of the PMOS transistors P11, P12, P13, ..., P1$n$, the capacitance of the whole variable capacitor C1 can be controlled. The variable capacitor C2 is structured in a similar way.

For example, by controlling the input-referred offset voltage before shipping, the manufacturing variations of the transistor elements can be cancelled. As a result, smaller transistor elements can be used, thereby realizing high-speed operation and low power consumption. As stated above, the technique of adjusting the offset amount using a variable capacitor is disclosed in the specification of U.S. Pat. No. 6,728,240.

Third Exemplary Embodiment

Figure 7:
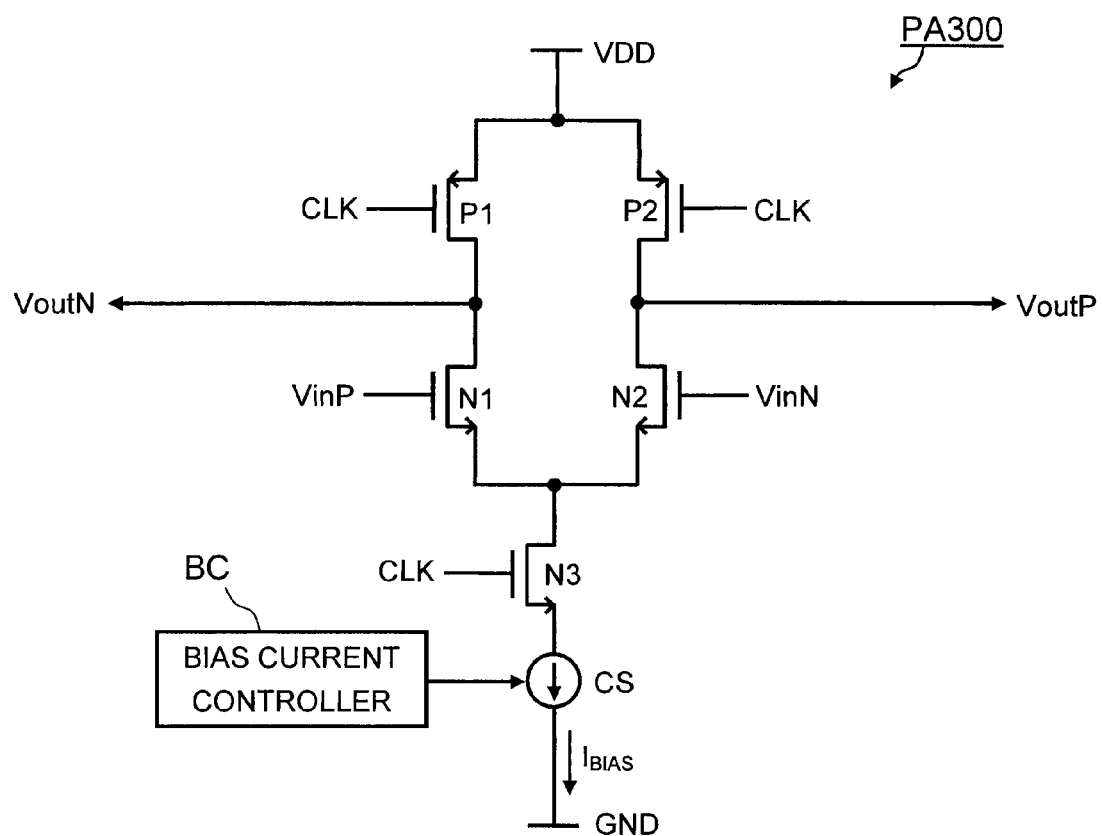
FIG. 7 is a circuit diagram of an amplifier according to a third exemplary embodiment.

Referring now to FIG. 7, the third exemplary embodiment of the present invention will be described. FIG. 7 is a circuit diagram of an amplifier according to the third exemplary embodiment. A preamp PA300 shown in FIG. 7 is different from the preamp PA100 shown in FIG. 1 in that a bias current controller BC that controls a bias current $I_{BIAS}$ of the constant current source CS is provided. The other structures are similar to those shown in FIG. 1, and thus description will be omitted.

Typically, there is an optimal bias current value $I_{BIAS}$ depending on the frequency $f_{CLK}$ Of the clock signal CLK. Description will be made on this point with reference to FIGS. 8A to 8D and 9A to 9D. FIGS. 8A to 8D are simulation waveform diagrams of the output signals from the preamp PA100 according to the first exemplary embodiment when the clock frequency $f_{CLK}$ is 2 GHz. FIG. 8A shows simulation waveform diagrams when the bias current $I_{BIAS}$ is 50 μA, and FIG. 8B shows simulation waveform diagrams when the bias current $I_{BIAS}$ is 15 μA. FIG. 8C shows waveforms of the input signals VinP, VinN. The input signal VinN has a certain value of 0.55 V, and the input signal VinP is swept. FIG. 8D is a waveform of the clock signal CLK (frequency $f_{CLK}$=2 GHz).

On the other hand, FIGS. 9A to 9D are simulation waveform diagrams of the output signals from the preamp PA100 according to the first exemplary embodiment when the clock frequency $f_{CLK}$ is 200 MHz. As is similar to FIGS. 8A to 8D, FIG. 9A shows simulation waveform diagrams when the bias current $I_{BIAS}$ is 50 μA, and FIG. 9B shows simulation waveform diagrams when the bias current $I_{BIAS}$ is 15 μA. FIG. 9C shows waveforms of the input signals VinP, VinN. The input signal VinN has a certain value of 0.55 V, and the input signal VinP is swept. FIG. 9D shows a waveform of the clock signal CLK (frequency $f_{CLK}$=200 MHz).

When the clock frequency $f_{CLK}$ is 2 GHz, the amplification gain of the difference of the output signals VoutP and VoutN is larger in a case in which the bias current $I_{BIAS}$ is 50 μA shown in FIG. 8A rather than in a case in which the bias current $I_{BIAS}$ is 15 μA shown in FIG. 8B. Thus, more stable operation is realized when the bias current $I_{BIAS}$ is 50 μA.

On the other hand, when the clock frequency $f_{CLK}$ is 200 MHz, a period in which the difference between the output signals VoutP and VoutN is sufficiently large is longer in a case of the bias current $I_{BIAS}$=15 μA shown in FIG. 9B than in a case of the bias current $I_{BIAS}$=50 μA shown in FIG. 9A. Thus, the timing margin of taking the signals by the comparator CMP in the subsequent stage can further be increased when the bias current $I_{BIAS}$ is 15 μA, whereby it is possible to realize further stable operation.

It is more preferable that the bias current $I_{BIAS}$ is 50 μA when the clock frequency $f_{CLK}$ is 2 GHz, and the bias current $I_{BIAS}$ is 15 μA when the clock frequency $f_{CLK}$ is 200 MHz. Accordingly, when operated in two or more modes by switching the clock frequency $f_{CLK}$, the preamp PA300 according to the third exemplary embodiment is able to control the bias current $I_{BIAS}$, whereby more stable operation is made possible in each frequency. As a matter of course, the variable capacitors C1, C2 according to the second exemplary embodiment may be added to the preamp PA300 according to the third exemplary embodiment.

Fourth Exemplary Embodiment

Figure 10:
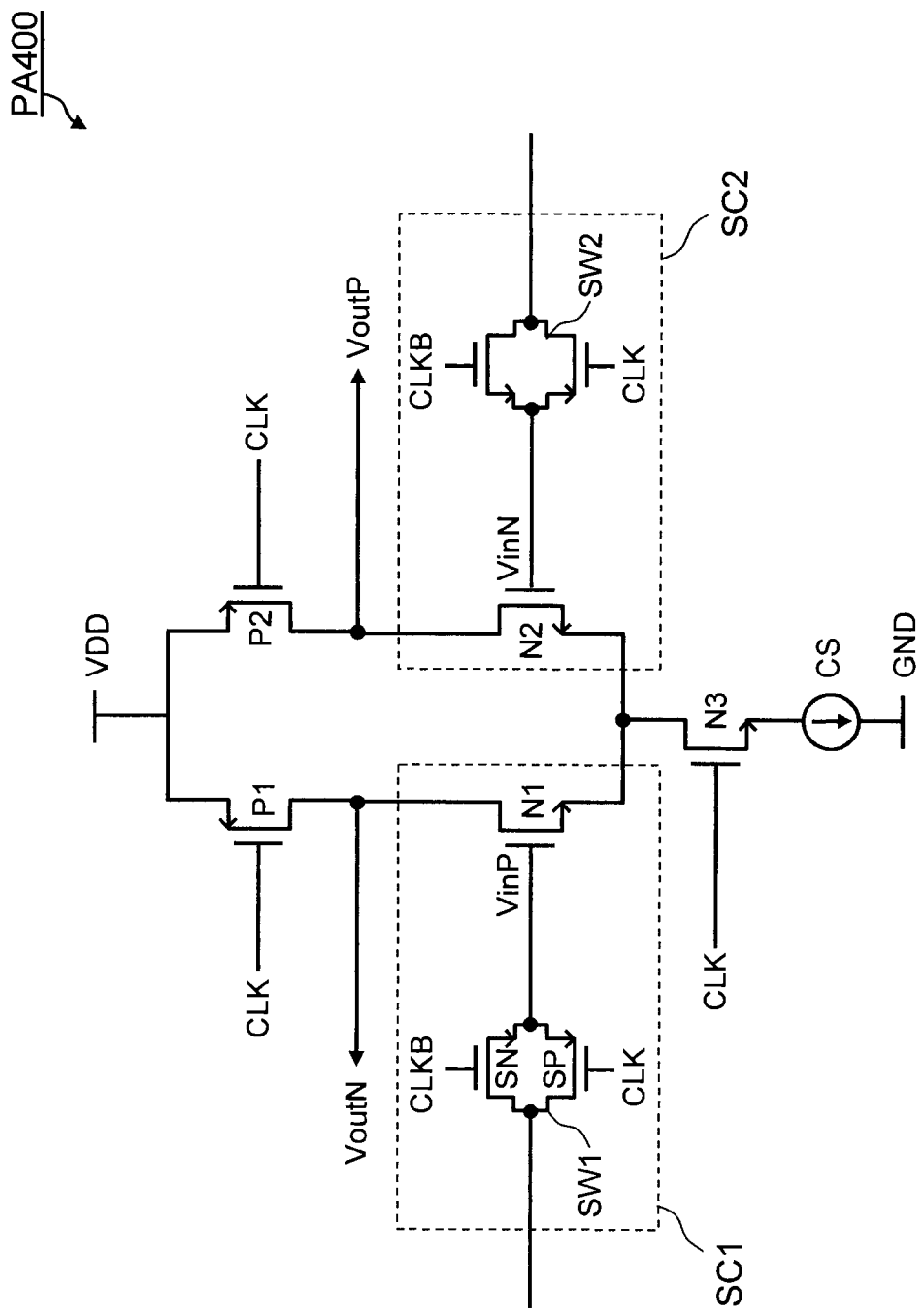
FIG. 10 is a circuit diagram of an amplifier according to a fourth exemplary embodiment.

Referring next to FIG. 10, the fourth exemplary embodiment of the present invention will be described. FIG. 10 is a circuit diagram of an amplifier according to the fourth exemplary embodiment. A preamp PA400 according to the fourth exemplary embodiment is different from the circuit diagram of the preamp PA100 according to the first exemplary embodiment in that sampling circuits SC1, SC2 are added. The other structures are similar to those shown in FIG. 1, and thus description will be omitted.

As shown in FIG. 10, the sampling circuit SC1 includes a switch SW1 and a sampling capacitor. Here, a gate capacitor of the input transistor N1 is used as the sampling capacitor. Similarly, the sampling circuit SC2 includes a switch SW2 and a sampling capacitor. Here, a gate capacitor of the input transistor N2 is used as the sampling capacitor. The switch SW1 is formed by an NMOS transistor SN and a PMOS transistor SP that are connected in parallel. A CMOS transfer gate is suitable as such a structure. The switch SW2 has the similar structure.

An inverting clock signal CLKB is input to a gate of the NMOS transistor SN that forms the switch SW1, and a clock signal CLK is input to a gate of the PMOS transistor SP.

In the period of the clock signal CLK=L, both of the NMOS transistor SN and the PMOS transistor SP that form the switch SW1 are ON, which means the sampling period. During this period, the preamp PA400 is in the reset period. On the other hand, in the period of the clock signal CLK=H, both of the NMOS transistor SN and the PMOS transistor SP that form the switch SW1 are OFF, which means the holding period. During this period, the preamp PA400 is in the amplification period.

Even with such a structure, it is possible to provide the amplifier that is stably operated for wide range of input common voltage with low power consumption. As a matter of course, the sampling circuits SC1 and SC2 may be added to the preamp PA200 according to the second exemplary embodiment and the preamp PA300 according to the third exemplary embodiment.

Fifth Exemplary Embodiment

Figure 11:
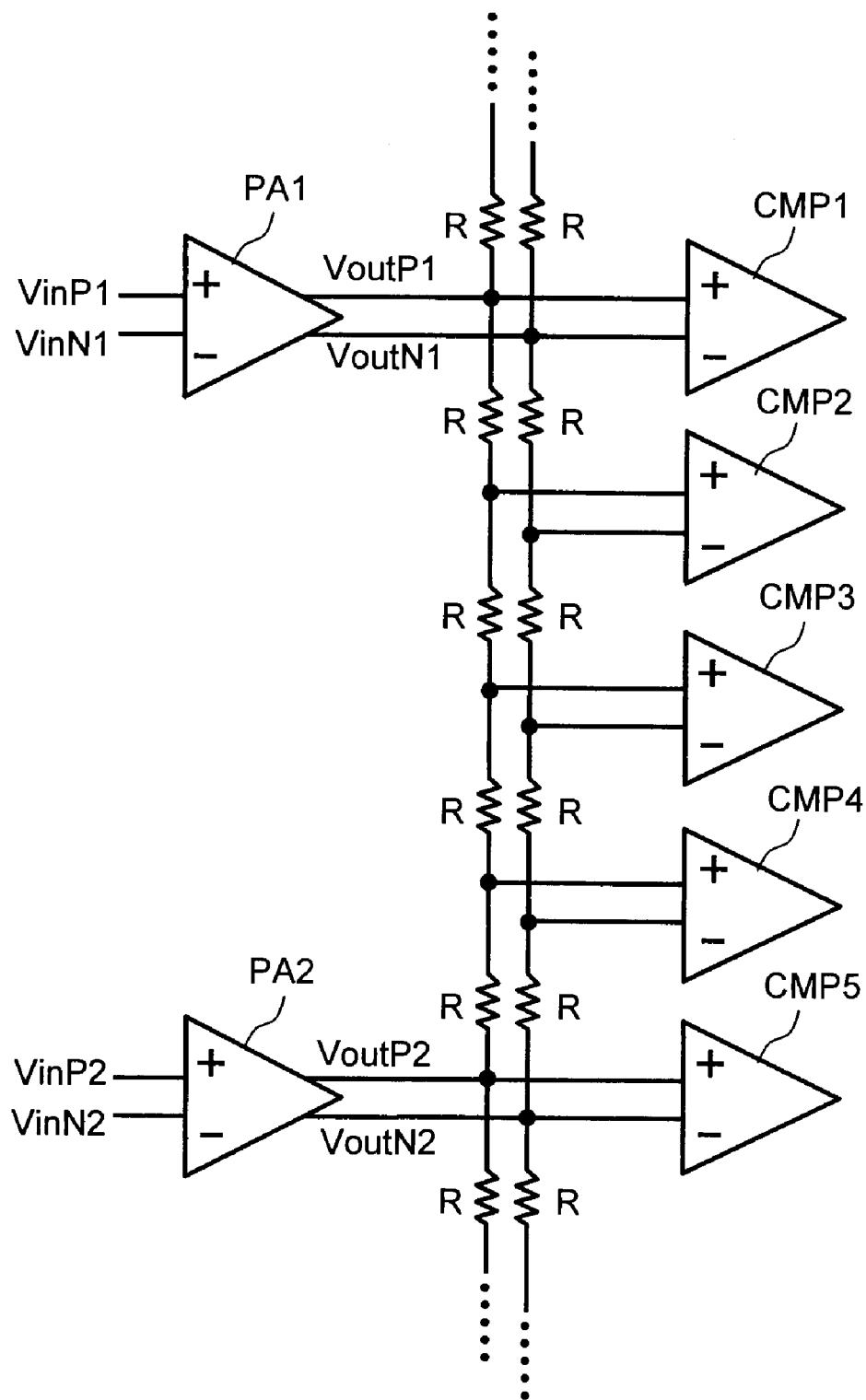
FIG. 11 is a circuit diagram of an interpolating A/D converter according to a fifth exemplary embodiment.

Referring next to FIG. 11, the fifth exemplary embodiment of the present invention will be described. FIG. 11 is a circuit diagram showing an interpolating A/D converter according to the fifth exemplary embodiment. The A/D converter according to the fifth exemplary embodiment is an example in which any of the preamps PA100 to PA400 according to the first to fourth exemplary embodiments is applied to preamps PA1 and PA2 of the interpolating A/D converter. With such a structure, the interpolating A/D converter with low power consumption can be provided.

As shown in FIG. 11, an output node of an output signal VoutN1 of the preamp PA1 is connected to an inverting input terminal of a comparator CMP1. Further, the output node of the output signal VoutN1 is connected in series to inverting input terminals of comparators CMP2 to CMP5 through each resistor R. On the other hand, an output node of an output signal VoutP1 of the preamp PA1 is connected to a non-inverting input terminal of the comparator CMP1. Further, the output node of the output signal VoutP1 is connected in series to non-inverting input terminals of the comparators CMP2 to CMP5 through each resistor R.

Similarly, an output node of an output signal VoutN2 of the preamp PA2 is connected to an inverting input terminal of the comparator CMP5. Further, the output node of the output signal VoutN2 is connected in series to inverting input terminals of the comparators CMP4 to CMP1 through each resistor R. On the other hand, an output node of an output signal VOutP2 of the preamp PA2 is connected to non-inverting input terminal of the comparator CMP5. Further, the output node of the output signal VoutP2 is connected to non-inverting input terminals of the comparators CMP4 to CMP1 through each resistor R.

Sixth Exemplary Embodiment

Figure 12:
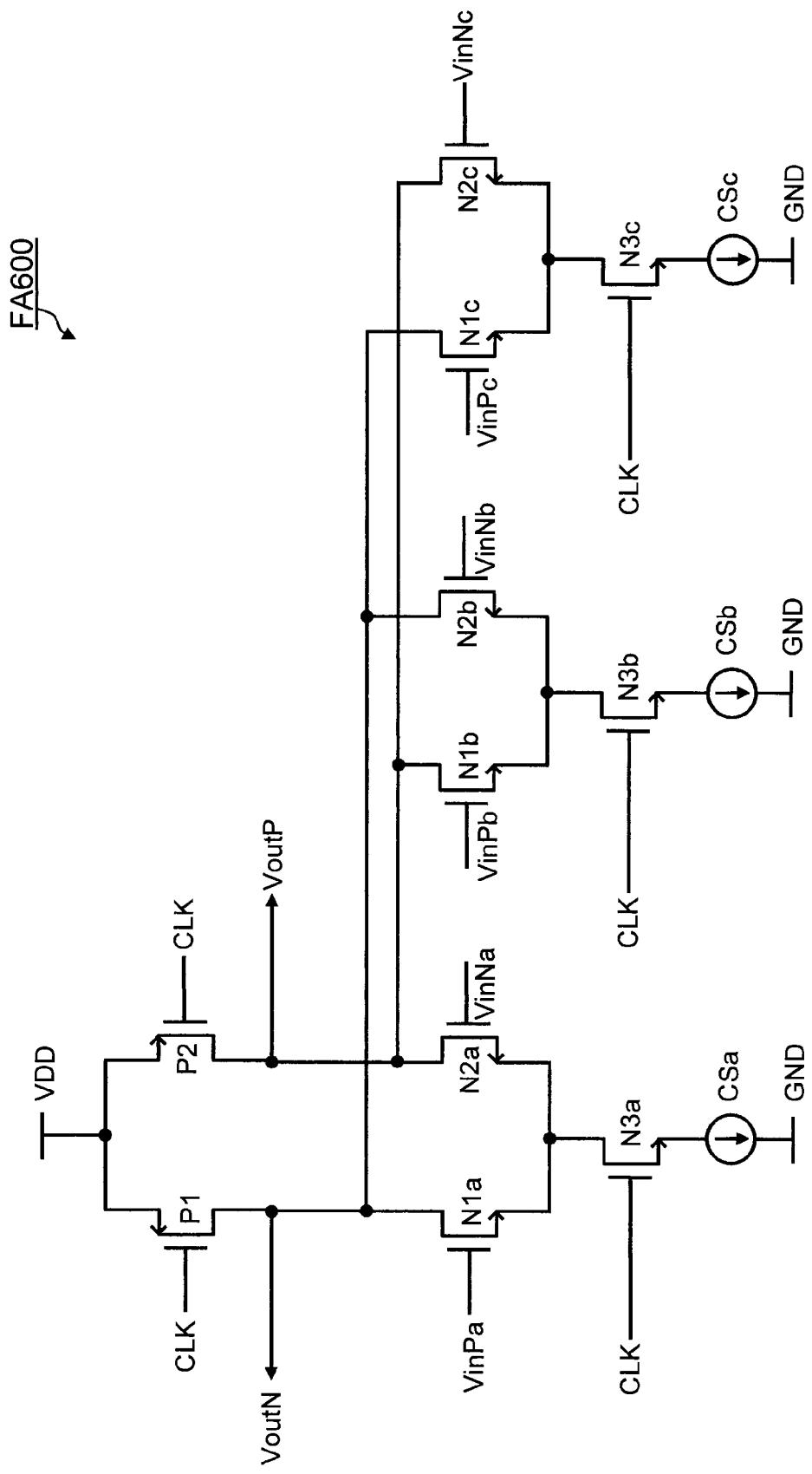
FIG. 12 is a circuit diagram of an amplifier according to a sixth exemplary embodiment.
Figure 13:
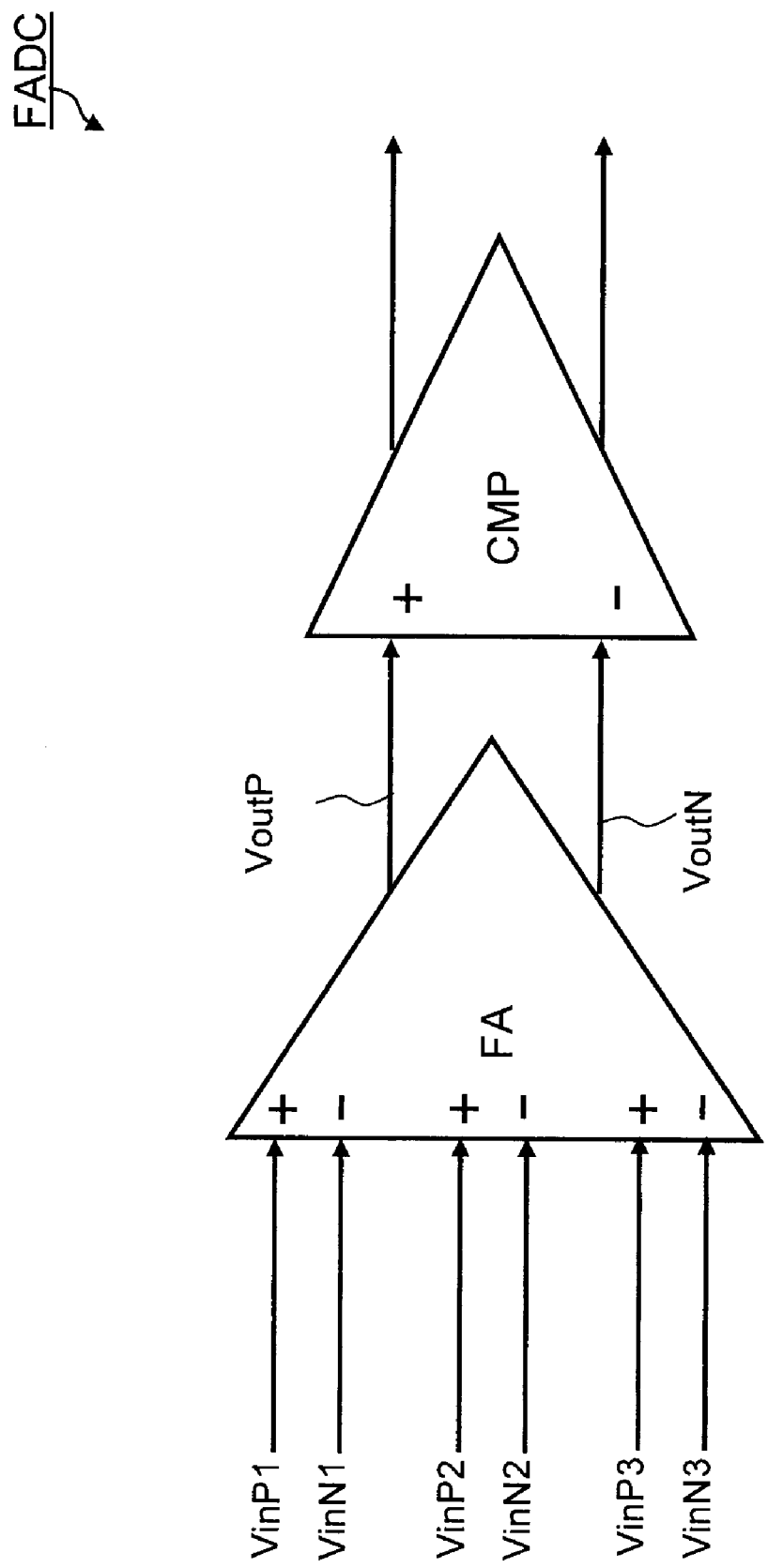
FIG. 13 is a diagram showing an example in which the amplifier according to the sixth exemplary embodiment is applied to a folding type analog/digital (A/D) converter FADC.

Referring next to FIG. 12, the sixth exemplary embodiment of the present invention will be described. FIG. 12 is a circuit diagram of an amplifier according to the sixth exemplary embodiment. Further, FIG. 13 is a diagram showing an example in which the amplifier according to the sixth exemplary embodiment is applied to a folding type analog/digital (A/D) converter FADC. As shown in FIG. 13, a folding amplifier FA amplifies input signals VinP1 to VinP3 and VinN1 to VinN3, and outputs output signals VoutP and VoutN to the comparator CMP. A folding amplifier FA600 shown in FIG. 12 is suitable as the folding amplifier FA shown in FIG. 13. The folding amplifier FA600 combines a plurality of input signals, and generates folding signals.

As shown in FIG. 12, the folding amplifier FA600 includes three pairs of input transistors N1a, N2a, N1b, N2b, and N1c, N2c, three switch transistors N3a, N3b, N3c, and three constant current sources CSa, CSb, CSc.

Now, sources of the load transistors P1, P2 are both connected to a power supply (power supply voltage VDD). A drain of the load transistor P1 is connected to drains of the input transistors N1a, N2b, N1c that are connected in parallel. A drain of the load transistor P2 is connected to drains of the input transistors N2a, N1b, N2c that are connected in parallel. The output signal VoutN is output from a node (output node) between the drain of the load transistor P1 and the drains of the input transistors N1a, N2b, N1c, and the output signal VoutP is output from a node (output node) between the drain of the load transistor P2 and the drains of the input transistors N2a, N1b, N2c.

Now, sources of the input transistors N1a, N2a are both connected to a drain of the switch transistor N3a. An input signal VinPa is input to a gate of the input transistor N1a. An input signal VinNa is input to a gate of the input transistor N2a. A source of the switch transistor N3a is connected to one terminal of the constant current source CSa. The other terminal of the constant current source CSa is connected to the ground.

Similarly, sources of the input transistors N1b, N2b are both connected to a drain of the switch transistor N3b. An input signal VinPb is input to a gate of the input transistor N1b. An input signal VinNb is input to a gate of the input transistor N2b. A source of the switch transistor N3b is connected to one terminal of the constant current source CSb. The other terminal of the constant current source CSb is connected to the ground.

Similarly, sources of the input transistors N1c, N2c are both connected to a drain of the switch transistor N3c. An input signal VinPc is input to a gate of the input transistor N1c. An input signal VinNc is input to a gate of the input transistor N2c. A source of the switch transistor N3c is connected to one terminal of the constant current source CSc. The other terminal of the constant current source CSc is connected to the ground.

Further, the clock signal CLK is input to gates of the load transistors P1, P2 and gates of the switch transistors N3a, N3b, N3c. Thus, the load transistors P1, P2 and the switch transistors N3a, N3b, N3c are turned on or off in a complementary manner.

Specifically, when the clock signal CLK is H, the load transistors P1, P2 are OFF, the switch transistors N3a, N3b, N3c are ON, which means the amplification period. The preamp PA100 according to the sixth exemplary embodiment includes the constant current sources CSa, CSb, CSc between three pairs of input transistors N1a, N2a, N1b, N2b, and N1c, N2c and the ground, respectively. Hence, the range of each input common voltage can be widened due to the same reason as in the first exemplary embodiment.

On the other hand, when the clock signal CLK is L, the load transistors P1, P2 are ON, and the switch transistors N3a, N3b, N3c are OFF, which means the reset period. In the reset period, the output signals VoutP, VoutN are both reset to the power supply voltage VDD. Further, in the reset period, the switch transistors N3a, N3b, N3c are OFF, and the current is interrupted. Thus, low power consumption is realized. In summary, the folding amplifier FA600 according to the sixth exemplary embodiment can be stably operated for wide range of input common voltage with low power consumption.

Seventh Exemplary Embodiment

Figure 14:
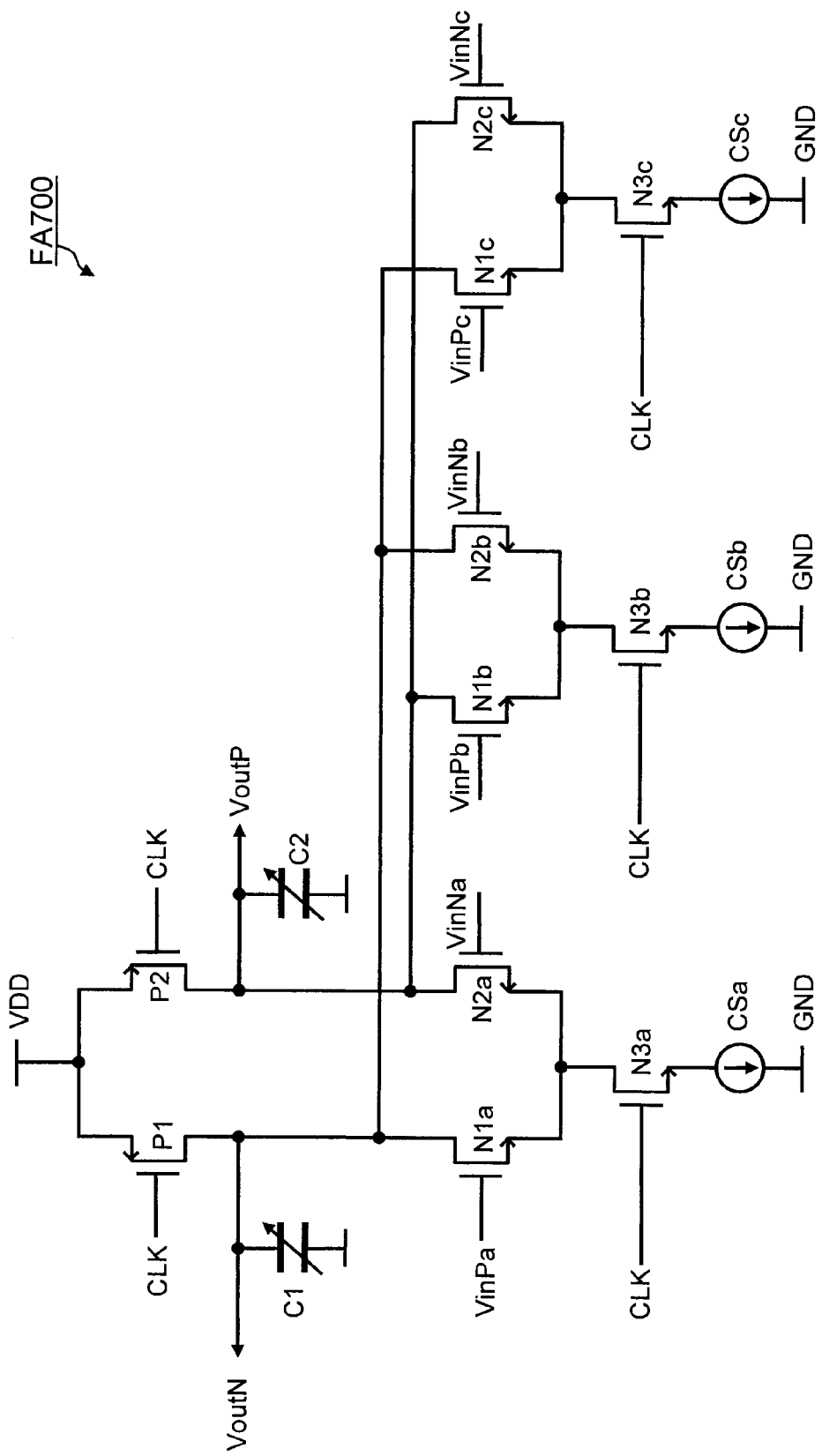
FIG. 14 is a circuit diagram of an amplifier according to a seventh exemplary embodiment.

Referring next to FIG. 14, the seventh exemplary embodiment of the present invention will be described. FIG. 14 is a circuit diagram of an amplifier according to the seventh exemplary embodiment. A folding amplifier FA700 shown in FIG. 14 is different from the folding amplifier FA600 shown in FIG. 12 in that the variable capacitors C2 and C1 according to the second exemplary embodiment are connected to the output nodes of the output signals VoutP, VoutN. The other structures are similar to those shown in FIG. 12, and thus description will be omitted. The folding amplifier FA700 according to the seventh exemplary embodiment is stably operated for wide range of input common voltage with low power consumption. Further, as it is possible to control the input-referred offset voltage, further high-speed operation and low power consumption are realized.

Eighth Exemplary Embodiment

Figure 15:
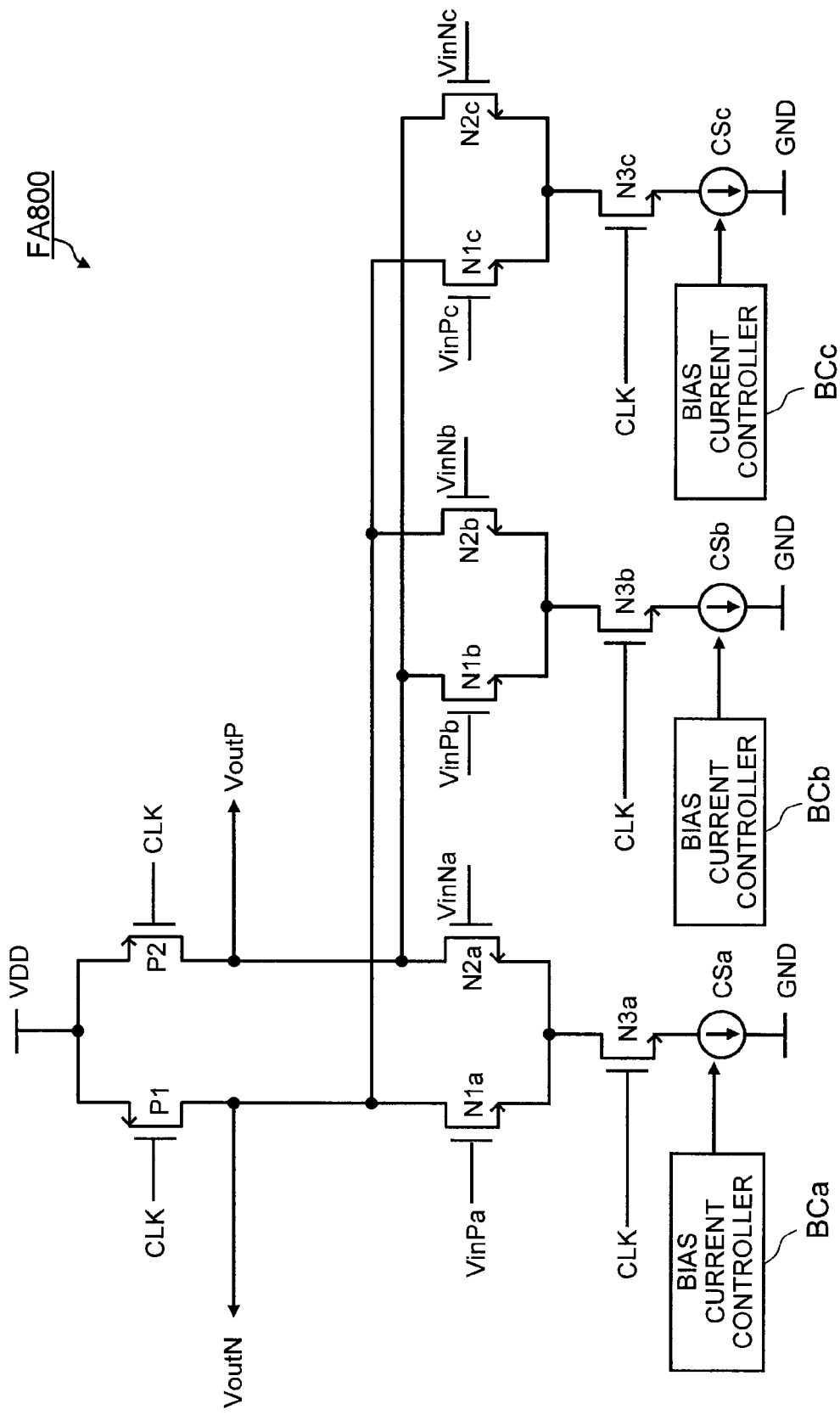
FIG. 15 is a circuit diagram of an amplifier according to an eighth exemplary embodiment.

Referring next to FIG. 15, the eighth exemplary embodiment of the present invention will be described. FIG. 15 is a circuit diagram of an amplifier according to the eighth exemplary embodiment. Now, a folding amplifier FA800 shown in FIG. 15 is different from the folding amplifier FA600 shown in FIG. 12 in that the bias current controller BC that controls the bias current $I_{BIAS}$ of the constant current source CS according to the third exemplary embodiment is provided. The other structures are similar to those shown in FIG. 12, and thus description will be omitted. The folding amplifier FA800 according to the eighth exemplary embodiment is stably operated for wide range of input common voltage with low power consumption. Further, the folding amplifier FA800 is able to control the bias current $I_{BIAS}$, whereby it is possible to realize further stable operation in each frequency. As a matter of course, the variable capacitors C1 and C2 according to the second exemplary embodiment may be added to the folding amplifier FA800 according to the eighth exemplary embodiment.

Ninth Exemplary Embodiment

Figure 16:
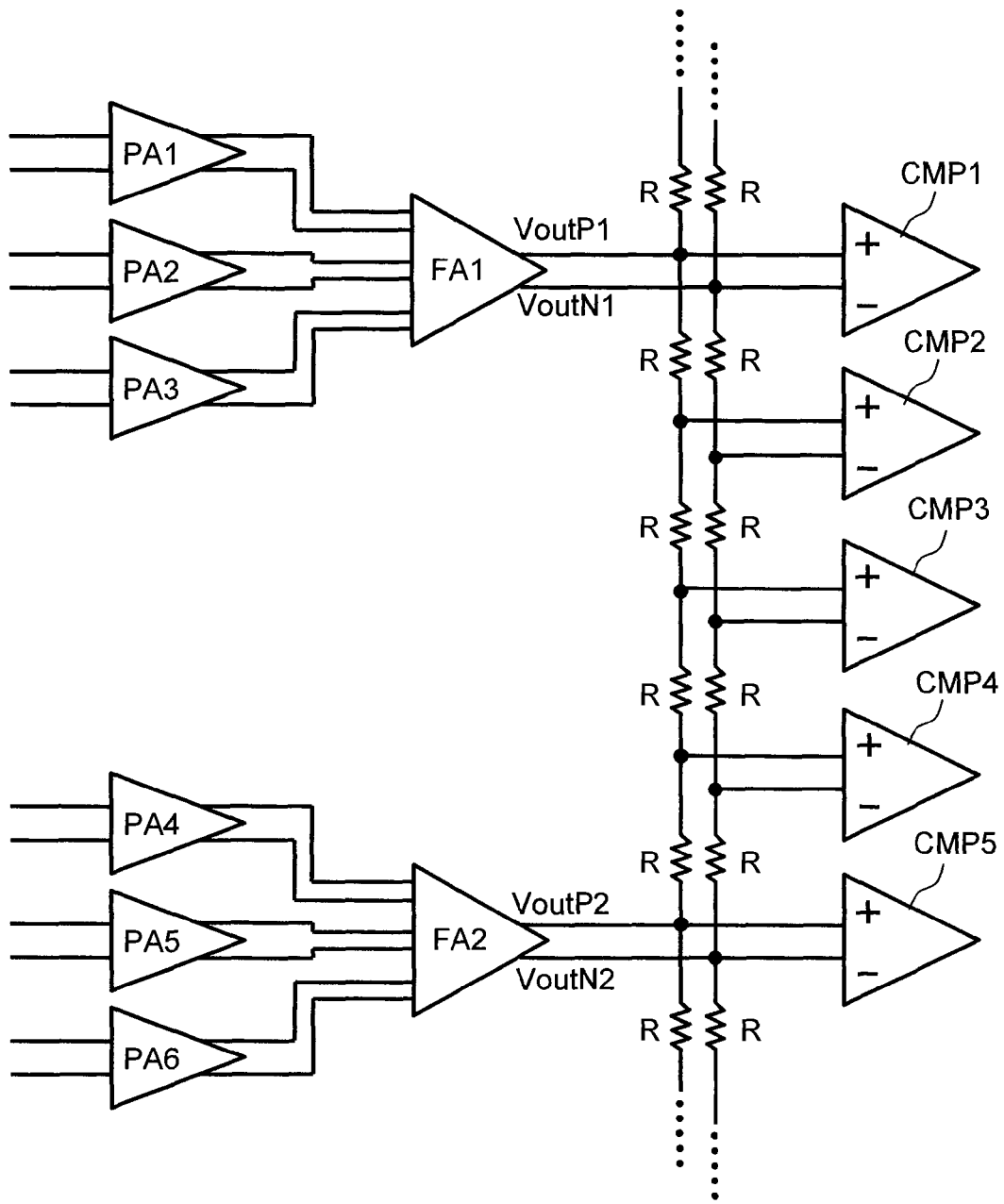
FIG. 16 is a circuit diagram of a folding interpolating A/D converter according to a ninth exemplary embodiment.

Referring next to FIG. 16, the ninth exemplary embodiment of the present invention will be described. FIG. 16 is a circuit diagram of a folding interpolating A/D converter according to the ninth exemplary embodiment. The A/D converter according to the ninth exemplary embodiment is the example in which any of the folding amplifiers FA600 to FA800 according to the sixth to eighth exemplary embodiments is applied to folding amplifiers FA1, FA2 of the interpolating A/D converter. With such a structure, the folding interpolating A/D converter with low power consumption can be provided.

As shown in FIG. 16, the folding amplifier FA1 combines input signals from preamps PA1 to PA3, and outputs output signals VoutN1, VoutP1. Similarly, the folding amplifier FA2 combines input signals from preamps PA4 to PA6, and outputs output signals VoutN2, VoutP2.

An output node of an output signal VoutN1 of the folding amplifier FA1 is connected to an inverting input terminal of the comparator CMP1. Further, the output node of the output signal VoutN1 is connected in series to inverting input terminals of the comparators CMP2 to CMP5 through each resistor R. On the other hand, an output node of an output signal VoutP1 of the folding amplifier FA1 is connected to a non-inverting input terminal of the comparator CMP1. Further, the output node of the output signal VoutP1 is connected in series to non-inverting input terminals of the comparators CMP2 to CMP5 through each resistor R.

Similarly, an output node of an output signal VoutN2 of the folding amplifier FA2 is connected to an inverting input terminal of the comparator CMP5. Further, the output node of the output signal VoutN2 is connected in series to inverting input terminals of comparators CMP4 to CMP1 through each resistor R. On the other hand, an output node of an output signal VoutP2 of the folding amplifier FA2 is connected to a non-inverting input terminal of the comparator CMP5. Further, the output node of the output signal VoutP2 is connected in series to non-inverting input terminals of the comparators CMP4 to CMP1 through each resistor R.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An amplifier that is operated between first and second power supplies, comprising:
   a transistor pair having control terminals to which input signals are input;
   a load resistor pair that is provided between each transistor of the transistor pair and the first power supply;
   a constant current source that is provided between the second power supply and the transistor pair; and
   a first switch that is connected with the constant current source in series between the second power supply and the transistor pair, the first switch being turned on or off in accordance with a clock signal,
   wherein the load resistor pair is a second switch, formed by transistors, that is turned on or off in a complementary manner with the first switch in accordance with the clock signal.

2. The amplifier according to claim 1, wherein
   the first switch is formed by a transistor of a first conductive type, and
   the second switch is formed by transistors of a second conductive type, the second conductive type being different from the first conductive type.

3. The amplifier according to claim 1, further comprising variable capacitors at output nodes between the transistor pair and the load resistor pair.

4. The amplifier according to claim 1, further comprising a bias current controller that controls bias current generated by the constant current source.

5. The amplifier according to claim 1, wherein the amplifier is of a folding type.

6. The amplifier according to claim 1, wherein the transistors are MOS transistors.

7. An analog/digital converter that comprises:
the amplifier according to claim 1; and
a comparator to which signals output from the amplifier are input.

8. An interpolating analog/digital converter that comprises:
the first and second amplifiers according to claim 1;
a first resistor that is connected to an output terminal of the first amplifier;
a second resistor that is connected to an output terminal of the second amplifier; and
a comparator to which a signal that is output from a node is input, the node being the one at which the first and the second resistors are connected to each other.

9. An amplifier that is operated between first and second power supplies, comprising:

a transistor pair having control terminals to which input signals are input;
a load resistor pair that is provided between each transistor of the transistor pair and the first power supply;
a constant current source that is provided between the second power supply and the transistor pair;
a first switch that is connected with the constant current source in series between the second power supply and the transistor pair, the first switch being turned on or off in accordance with a clock signal; and
sampling circuits, each of the sampling circuits comprising:
a second switch that is turned on or off in a complementary manner with the first switch in accordance with the clock signal; and
a sampling capacitor that samples the input signal.

10. The amplifier according to claim 9, wherein the sampling capacitors are gate capacitors of the transistor pair.

* * * * *